United States Patent
Rindner

(10) Patent No.: US 8,793,639 B2
(45) Date of Patent: Jul. 29, 2014

(54) METHOD AND SYSTEM OF CONVERTING TIMING REPORTS INTO TIMING WAVEFORMS

(75) Inventor: Yossi Rindner, Modiin (IL)

(73) Assignee: Asicserve, Ltd., Herzylia Pituach (IL)

(*) Notice: Subject to any disclaimer, the term of this patent is extended or adjusted under 35 U.S.C. 154(b) by 423 days.

(21) Appl. No.: 13/206,126

(22) Filed: Aug. 9, 2011

(65) Prior Publication Data

US 2012/0036171 A1 Feb. 9, 2012

Related U.S. Application Data

(60) Provisional application No. 61/371,780, filed on Aug. 9, 2010.

(51) Int. Cl.
*G06F 17/50* (2006.01)

(52) U.S. Cl.
CPC .......... *G06F 17/5036* (2013.01); *G06F 17/504* (2013.01)
USPC .......................................... 716/134; 716/130

(58) Field of Classification Search
CPC . G06F 17/5036; G06F 1/266; G06F 2217/78; G06F 2217/82; G06F 17/504; G06F 3/033; G06F 15/0225; G06F 3/03545; G06F 3/03546; G06F 3/038; G06F 3/0383; G06K 9/0053; B43K 29/08; G01V 1/48; G01R 31/3177; Y04S 40/168

USPC ........................................... 716/125–130, 134
See application file for complete search history.

(56) References Cited

U.S. PATENT DOCUMENTS

| | | | |
|---|---|---|---|
| 7,523,426 B2 | 4/2009 | Dirks et al. | |
| 2006/0200784 A1* | 9/2006 | Ding et al. | 716/6 |
| 2007/0089076 A1* | 4/2007 | Amatangelo | 716/6 |
| 2007/0220473 A1* | 9/2007 | Goto | 716/11 |
| 2008/0005710 A1 | 1/2008 | Fomaciari et al. | |
| 2009/0055787 A1 | 2/2009 | Oh et al. | |
| 2009/0150846 A1 | 6/2009 | Dirks et al. | |
| 2009/0306953 A1 | 12/2009 | Liu et al. | |

* cited by examiner

*Primary Examiner* — Binh Tat
(74) *Attorney, Agent, or Firm* — Matthew J. Lattig; Charter IP, LLC

(57) ABSTRACT

A method and system of converting an ASCII timing report to a timing waveform to evaluate the behavior of an electrical signal in an ASIC is described. In the method, a timing report is read into memory, and selected timing points are extracted therefrom. A timing waveform is generated from the extracted timing points for display and review by a designer to evaluate whether a given external port or internal pin of the ASIC meets required timing specifications. To create a combined timing waveform, max and min timing waveforms are generated from selected timing points extracted from max and min timing reports. The x-y coordinates of the min timing waveform are shifted by an adjustment factor so as to align with x-y coordinates the max timing waveform, then a combined timing waveform is generated from the x-y coordinates of both the max and min timing waveforms.

18 Claims, 17 Drawing Sheets

Startpoint: core/u_rbu/spi_cs_1_0_n_reg  /202    /206
                 /204   (rising edge-triggered flip-flop clocked by aferxck)
Endpoint: mfio[2] (output port clocked by spick)
Path Group: spick             \ 207
Path Type: max

```
Point                              Fanout   Cap    Trans    Incr     Path
----------------------------------------------------------------------------
clock aferxck (rise edge)    208                           37.500   37.500
clock source latency    229                                 0.000   37.500
AA_afe/udigital/uclk/uclkgen/CORE_CLK2X (cc_k103_khnafeclk_gen)
                                                  0.000    0.000   37.500 r
AA_afe/udigital/uifc/urxclk_gc/I_GCAND/GCOUT (LGC_AND_8)
                                                  0.000    0.463 * 38.919 r
AA_afe/udigital/uifc/urxclk_gc/GCOUT (net)
                                      1  0.056
AA_afe/udigital/uifc/urxclk_gc/GCOUT (SGCAD2_SPC_1246)
                                                  0.000    0.000 * 38.919
rcore/u_rbu/sys_wr_gclk/clk_gate_latch/I_GCAND/GCOUT (LGC_AND_8)
                                                  0.000    0.409 * 43.697 r
core/u_rbu/sys_wr_gclk/clk_gate_latch/GCOUT (net)
                                      1  0.010
core/u_rbu/sys_wr_gclk/clk_gate_latch/GCOUT (SGCAD2_SPC_1919)
                                                  0.000    0.000 * 43.697 r
core/u_rbu/clk_gate_map_sync_dsm_pos_n_neg_reg/latch/I_GCAND/GCOUT (LGC_AND_8)
                                                  0.000    0.471 * 44.656 r
core/u_rbu/clk_gate_map_sync_dsm_pos_n_neg_reg/latch/GCOUT (net)
                                     16  0.091
core/u_rbu/clk_gate_map_sync_dsm_pos_n_neg_reg/latch/GCOUT (SGCAD2_SPC_1926)
                                  203             0.000    0.000 * 44.656 r
core/u_rbu/spi_cs_1_0_n_reg/CK (GFSDPRB_1)        0.000    0.006 * 44.662 r  => LCD = 44.652 - 37.5 = 7.162ns
core/u_rbu/spi_cs_1_0_n_reg/Q  (GFSDPRB_1)        0.000    0.465 * 45.127 f
mfio[2] (inout)                                   0.000    0.000   53.472 f  => DD = 53.472 - 45.127 = 8.345ns
data arrival time     210       205                                53.472
                                                                              226(MAX)
```

FIG. 3

```
                                                    ┌─ 219
clock spick (fall edge)                            75.000    75.000
clock aferxck (source latency)                      0.000    75.000
AA_afe/udigital/uclk/uclkgen/CORE_CLK2X (cc_kl03_khnafeclk_gen)
                                         0.000      0.000    75.000 r
AA_afe/udigital/ufc/urxclk_gc/I_GCAND/GCOUT (LGC_AND_8)
                                        -0.010      0.463 *  76.419 r
AA_afe/udigital/ufc/urxclk_gc/GCOUT (net)
                                1         0.056
AA_afe/udigital/ufc/urxclk_gc/GCOUT (SGCAD2_SPC_1246)
                                         0.000      0.000 *  76.419 r
core/u_rbu/u_spi/sclk_out_reg/Q (GFSDPR3Q_1)
       ┌─ 211                            0.000      0.412 *  82.115 f          ┌─ 214
mfio[9] (inout)                         -0.010      0.000    89.190 f  =>  CCD = 89.19 - 75 = 14.19ns
   clock uncertainty ──── 228                      -0.200    88.990
   output external delay ──── 216                  -5.000    83.990
   data required time                                        83.990
   ─────────────────────────────────────────────────────────────────
   data required time ──── 222                               83.990
   data arrival time  ──── 220                              -53.472
   ─────────────────────────────────────────────────────────────────
   slack (MET) ──── 224                                      30.518
```

FIG. 3 (CONT.)

Startpoint: core/u_rbu/spi_cs_1_0_n_reg  ⌐202
    ⌐204 (rising edge-triggered flip-flop clocked by aferxck)
Endpoint: mfio[2] (output port clocked by spick)  ⌐206
Path Group: spick  ⌐207
Path Type: min

```
Point                                          Fanout   Cap    Trans    Incr     Path
-----------------------------------------------------------------------------------
clock aferxck (rise edge)  208                                         37.500   37.500
clock source latency  229                                               0.000   37.500
AA_afe/udigital/uclk/uclkgen/CORE_CLK2X (cc_kl03_khnafeclk_gen)
                                                                0.000   0.000   37.500 r
AA_afe/udigital/uifc/urxclk_gc/I_GCAND/GCOUT (LGC_AND_8)
                                                               -0.010   0.463 * 38.919 r
AA_afe/udigital/uifc/urxclk_gc/GCOUT (net)
                                                 1      0.056
AA_afe/udigital/uifc/urxclk_gc/GCOUT (SGCAD2_SPC_1246)
                                                                0.000   0.000 * 38.919 r
core/u_rbu/sys_wr_gclk/clk_gate_latch/I_GCAND/GCOUT (LGC_AND_8)
                                                               -0.010   0.409 * 43.650 r
core/u_rbu/sys_wr_gclk/clk_gate_latch/GCOUT (net)
                                                 1      0.010
core/u_rbu/sys_wr_gclk/clk_gate_latch/GCOUT (SGCAD2_SPC_1919)
                                                                0.000   0.000 * 43.650 r
core/u_rbu/clk_gate_map_sync_dsm_pos_n_neg_reg/latch/I_GCAND/GCOUT (LGC_AND_8)
                                                               -0.010   0.471 * 44.609 r
core/u_rbu/clk_gate_map_sync_dsm_pos_n_neg_reg/latch/GCOUT (net)
                                                16      0.091
core/u_rbu/clk_gate_map_sync_dsm_pos_n_neg_reg/latch/GCOUT (SGCAD2_SPC_1926)
                                          203⌐         0.000   0.000 * 44.609 r       ⌐212
core/u_rbu/spi_cs_1_0_n_reg/CK (GFSDPRB_1)             -0.010   0.006 * 44.615 r => LCD = 44.615 - 37.5 = 7.115ns
   core/u_rbu/spi_cs_1_0_n_reg/Q (GFSDPRB_1)            0.000   0.367 * 44.982
 mfio[2] (inout)  ⌐210                    205⌐         0.000   0.000   48.563 r => DD = 48.563 - 44.982 = 3.581ns
data arrival time                                                      48.563
                                                                           ⌐226'(MIN)
```

FIG. 5

```
clock spick (fall edge)  ~219                    25.000    25.000
clock aferxck (source latency)                    0.000    25.000
AA_afe/udigital/uclk/uclkgen/CORE_CLK2X (cc_k103_khnafeclk_gen)
                                                  0.000     0.000    25.000 r
AA_afe/udigital/uifc/urxclk_gc/I_GCAND/GCOUI (LGC_AND_8)
                                                  0.000     0.463 *  26.419 r
AA_afe/udigital/uifc/urxclk_gc/GCOUT (net)
                                             1    0.056
AA_afe/udigital/uifc/urxclk_gc/GCOUT (SGCAD2_SPC_246)
                                                  0.000     0.000 *  26.419 r
core/u_rbu/u_spi/sclk_out_reg/Q (GFSDPREQ_1)
                                                  0.000     0.412 *  32.164 f
mfio[9] (inout)  ~211                             0.000     0.000    39.390 f   => CCD = 39.9 - 25 = 14.39ns
   output external delay ~216'                              5.000    44.390                        ⎣ 214
   data required time                                                44.390
   ----------------------------------------------------------------
   data required time  ~220                                          44.390
   data arrival time   ~222                                         -48.563
   ----------------------------------------------------------------
   slack (MET)  ~224'                                                 4.173
```

FIG. 5 (CONT.)

| Output Port | Output Delay | | | | Related Clock | IO Margin - Min | | | IO Margin - Max | | |
|---|---|---|---|---|---|---|---|---|---|---|---|
| | Min Rise | Min Fall | Max Rise | Max Fall | | wc | | | wc | | |
| dex[15] | -0.4 | -0.4 | 1.4 | 1.4 | sram_clk | 1.750 | Wh | Whs | -0.342 | Ws | Whs |
| dex[14] | -0.4 | -0.4 | 1.4 | 1.4 | sram_clk | 1.780 | Wh | Whs | -0.345 | Ws | Whs |
| dex[13] | -0.4 | -0.4 | 1.4 | 1.4 | sram_clk | 1.827 | Wh | Whs | -0.310 | Ws | Whs |
| dex[12] | -0.4 | -0.4 | 1.4 | 1.4 | sram_clk | 1.971 | Wh | Whs | -0.335 | Ws | Whs |
| dex[11] | -0.4 | -0.4 | 1.4 | 1.4 | sram_clk | 1.775 | Wh | Whs | -0.353 | Ws | Whs |
| dex[10] | -0.4 | -0.4 | 1.4 | 1.4 | sram_clk | 1.810 | Wh | Whs | -0.353 | Ws | Whs |
| dex[9] | -0.4 | -0.4 | 1.4 | 1.4 | sram_clk | 1.692 | Wh | Whs | -0.334 | Ws | Whs |
| dex[8] | -0.4 | -0.4 | 1.4 | 1.4 | sram_clk | 1.699 | Wh | Whs | -0.205 | Ws | Whs |
| dex[7] | -0.4 | -0.4 | 1.4 | 1.4 | sram_clk | 1.855 | Wh | Whs | -0.305 | Ws | Whs |
| dex[6] | -0.4 | -0.4 | 1.4 | 1.4 | sram_clk | 1.914 | Wh | Whs | -0.376 | Ws | Whs |
| dex[5] | -0.4 | -0.4 | 1.4 | 1.4 | sram_clk | 1.706 | Wh | Whs | -0.161 | Ws | Whs |
| dex[4] | -0.4 | -0.4 | 1.4 | 1.4 | sram_clk | 1.792 | Wh | Whs | -0.292 | Ws | Whs |
| dex[3] | -0.4 | -0.4 | 1.4 | 1.4 | sram_clk | 1.767 | Wh | Whs | -0.213 | Ws | Whs |
| dex[2] | -0.4 | -0.4 | 1.4 | 1.4 | sram_clk | 1.923 | Wh | Whs | -0.592 | Ws | Whs |
| dex[1] | -0.4 | -0.4 | 1.4 | 1.4 | sram_clk | 1.658 | Wh | Whs | -0.140 | Ws | Whs |
| dex[0] | -0.4 | -0.4 | 1.4 | 1.4 | sram_clk | 1.549 | Wh | Whs | -0.127 | Ws | Whs |

METHOD AND SYSTEM OF CONVERTING TIMING REPORTS INTO TIMING WAVEFORMS

PRIORITY STATEMENT

The present application claims the benefit under 35 U.S.C. §119(e) of U.S. Provisional Patent Application Ser. No. 61/371,780 to the inventor, filed Aug. 9, 2010 and entitled "METHOD AND SYSTEM OF CONVERTING TIMING REPORTS INTO TIMING WAVEFORMS", the entire contents of which is hereby incorporated by reference herein.

BACKGROUND

1. Field

Example embodiments in general are directed to a method and system for creating a combined timing waveform from a max ASCII timing report and a min ASCII timing report for an application specific integrated circuit (ASIC) or field programmable gate array (FPGA), a method of converting an ASCII timing report output from a STA tool to a timing waveform to evaluate the behavior of an electrical signal in an ASIC or FPGA, a method of determining multicycle path (MCP) max and min values to a design engineer for a given external port or internal pin of an ASIC or FPGA, and a method of verifying accuracy of a min MCP value for a given external port or internal pin of an ASIC or FPGA.

2. Related Art

FIG. 1 is a block diagram of a conventional art ASIC timing closure loop. In a typical ASIC design flow, the closed loop 10 of FIG. 1 governs the ASIC design practice. The closed loop 10 in general includes a series of five stages: a layout stage 11, STA (Static Timing Analysis) stage 12, RTL/synthesis stage 13, ECO (Electronic Change Order) stage 14 and timing constraints stage 15. For purposes of brevity the STA stage 12 is discussed in more detail hereafter.

One of the most time consuming stages in ASIC timing closure loop is the STA stage. This is due primarily to two reasons. First, many timing reports are generated by a "STA tool" and need to be analyzed by the ASIC design engineer. Secondly, the STA stage is the crucial junction within the loop 10, thus the correct course of action needs to be decided through analysis of such timing reports.

A general definition of STA may be understood as the ability to measure and analyze different timing paths within an electronic device, whether these timing paths meet predefined timing budgets allocated by the ASIC design engineer. The timing path is defined as the timing distance that an electrical signal travels between any two specific points in the electronic device. A timing path has as attributes a start point, end point, max path and min path. The start point denotes the beginning of the timing path; the end point the end of timing path. The maximum timing path is defined as the longest path between start point and end point, and the minimum timing path is defined as the shortest path between start point and end point. The timing path is measured in fractions of a second. The most common measurement unit is the nanosecond ($1/10e^9$ of a second), denoted by the abbreviation "ns".

A typical STA session requires reviewing timing reports related to the following topics:

Clocks definitions;
Check timing;
Case analysis;
Inter clocks slacks;
Intra clocks slacks;
IO definitions;
IO slacks;
False timing paths;
Multi-cycle timing path;
Asynchronous slacks;
Clock gating slacks;
Exceptions considered;
Exceptions ignored;
Cross clocks timing paths; and
Specific timing paths.

The amount or size of the timing reports can be significant (in a range of 10-100 Gbyte of ASCII timing reports, depending on the size of ASIC/FPGA, for any run of the STA tool) since it is desired to detect potential design or manufacturing flaws, and all the above report types need to be generated and analyzed for all possible PVT (Process, Voltage, Temperature) corners under which the ASIC should function. Further, ASCII (i.e., "plain text") representation of timing reports is not intuitive and can be difficult to visualize. This often overloads the ASIC design engineer, who needs to go through and analyze many of these reports.

SUMMARY

An example embodiment is directed to a method for creating a combined timing waveform from a max ASCII timing report and a min ASCII timing report for an application specific integrated circuit (ASIC), each timing path in an ASIC being described by max and min timing. In the method, x-y coordinates for a first waveform are calculated based on data contained in the max ASCII timing report, and x-y coordinates for a second waveform are calculated based on data contained in the min ASCII timing report, The x-y coordinates of the second waveform are shifted by an adjustment factor. A combined timing waveform is generated with the calculated x-y coordinates of the first waveform and the shifted x-y coordinates of the second waveform, the combined timing waveform reflecting the behavior of an electrical signal in the ASIC.

Another example embodiment is directed to system for creating a combined timing waveform from a max ASCII timing report and a min ASCII timing report for an application specific integrated circuit (ASIC), each timing path in an ASIC being described by max and min timing. The system includes a memory for storing the max and min ASCII timing reports, and a processor for calculating x-y coordinates for a first waveform based on data contained in the max ASCII timing report that the processor extracts from the memory. The processor calculates x-y coordinates for a second waveform based on data contained in the min ASCII timing report that the processor extracts from the memory, and iterates an algorithm to shift the calculated x-y coordinates of the second waveform by an adjustment factor. The system includes a display generating a combined timing waveform under direction of the processor with the calculated x-y coordinates of the first waveform and the shifted x-y coordinates of the second waveform, the combined timing waveform reflecting the behavior of an electrical signal in the ASIC.

Another example embodiment is directed to a method of converting an ASCII timing report to a timing waveform to evaluate the behavior of an electrical signal in an ASIC. In the method, a complete ASCII timing report is read into memory, and selected timing points are extracted from the stored report. A timing waveform is generated from the extracted timing points for display and review by a designer to evaluate whether a given external port or internal pin of the ASIC meets required timing specifications.

Another example embodiment is directed to a method of calculating multicycle path (MCP) values for a given timing path in an application specific integrated circuit (ASIC) or field programmable gate array (FPGA), each timing path in the ASIC/FPGA being described by max and min timing, the MCP values indicative of multi clock cycle behavior in the ASIC/FPGA In the method, x-y coordinates for a first waveform are calculated based on selected data points extracted from a max ASCII timing report, and x-y coordinates for a second waveform are calculated based on selected data points extracted from min ASCII timing report. The calculated x-y coordinates of the second waveform are shifted by an adjustment factor. A combined timing waveform is generated with the calculated x-y coordinates of the first waveform and the shifted x-y coordinates of the second waveform. A min multicycle path (MCP) value and a max MCP value is determined from the combined timing waveform.

Another example embodiment is directed to a method of creating a combined timing waveform from max and min timing data for a given external port or internal pin of an ASIC, the max and min timing data stored in a database of a STA tool. In the method, selected timing data related to a min path of the port or pin is extracted from the STA tool's database, and the extracted data is converted into x-y coordinates for a min timing waveform. Selected timing data related to a max path of the port or pin is extracted from the STA tool's database, and the extracted data is converted into x-y coordinates for a max timing waveform. The x-y coordinates of the min timing waveform are shifted by an adjustment factor. A combined timing waveform is generated with the calculated x-y coordinates of the max timing waveform and the shifted x-y coordinates of the min timing waveform; the combined timing waveform for review by a designer to evaluate whether the given external port or internal pin of the ASIC meets required timing specifications.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limitative of the example embodiments herein.

FIG. 3 is an example of a collapsed portion of a full max timing report for an output port of an ASIC and read into memory of the system, the collapsed portion extracted from memory and illustrating the timing points used for creating the x-y coordinates of a max timing waveform.

FIG. 5 is an example of a collapsed portion of a full min timing report for an output port of an ASIC and read into memory of the system, the collapsed portion extracted from memory and illustrating the timing points used for creating the x-y coordinates of a min timing waveform.

FIG. 10A is a screenshot of a portion of an excel summary sheet of output ports for a given ASIC.

DETAILED DESCRIPTION

In general, the example embodiments hereafter describe methods and a system of converting timing reports into timing waveforms. As to be described in further detail below, the system and methodologies parse ASCII timing reports in order to generate equivalent timing waveforms automatically.

In one example, the method and system may employ a programming language such as VBA (Visual Basic for Applications by Microsoft), although other programming languages such as C, C++ or C# (C sharp) may be employed. One advantage of VBA is that once created, the timing waveforms can be represented in the context of Microsoft Excel, which allows manipulating the timing waveforms further by Excel scripts, for example, but not limited to (a) creating links between the timing waveforms and the original timing reports; (b) tabulating the timing reports; (c) sorting the timing reports; and (d) filtering the timing reports.

The timing waveform should reflect the exact numbers and totals shown in the timing reports; otherwise the waveform information will be useless for ASIC design engineer. As to be shown in subsequent figures, the timing waveforms are displayed to the ASIC design engineer as electrical signals, which look like a data sheet of any electronic device.

Figure 2:
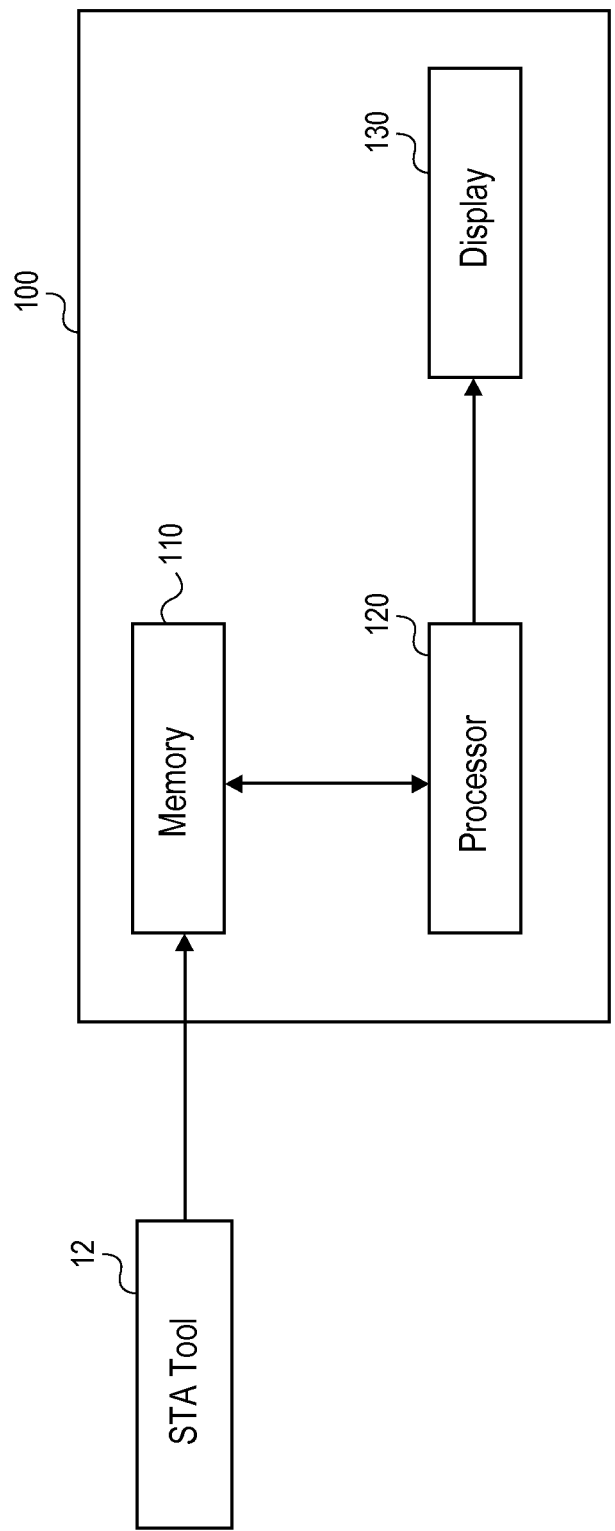
FIG. 2 is a block diagram of the system for creating a combined timing waveform from a max ASCII timing report and a min ASCII timing report for an ASIC or FPGA, and/or for converting an ASCII timing report to a timing waveform to evaluate the behavior of an electrical signal in the ASIC or FPGA.

FIG. 2 is a block diagram of a system for creating a combined timing waveform from a max ASCII timing report and a min ASCII timing report generated by a STA tool for an ASIC or FPGA, and/or for converting an ASCII timing report output from the STA tool to a timing waveform to evaluate the behavior of an electrical signal in the ASIC or FPGA.

Referring to FIG. 2, the system 100 is designed to support timing reports generated for any external port or internal pin of an ASIC or FPGA by a conventional STA tool 12, examples being PRIMETIME™ by Synopsys®, Encounter® Timing System by Cadence® and TEKTON™ by Magma® Design Automation, among others, for example. As each timing path in an ASIC/FPGA is described by max and min timing, the complete (original) max ASCII timing report output from the STA tool 12 is read into memory 110, where it is stored. Also, the complete (original) min ASCII timing report is output from the STA tool 12 and read into memory 110. Each of these reports will be used; specific timing points will be extracted from memory 110 by a software program iterated under the control of processor 120 in order to calculate x-y coordinates for generating timing waveforms to be displayed on a display 130 of the system 100. These waveforms contain information that can be visually reviewed by the designer/engineer to evaluate whether a given external port/internal pin of the ASIC/FPGA meets required timing specifications. In other words, the designer will be able to see the behavior of an electrical signal in the ASIC/FPGA to determine whether or not timing constraints are being met.

As previously noted in general above, in iterating the software program the processor 120, via an Excel software interface for example, is configured to create links between the timing waveforms and the original timing reports, tabulate and sort the timing reports, as well as filter the timing reports so as to extract the timing points used in calculating the x-y coordinates of the timing waveforms.

As will be shown in more detail below, the timing waveforms displayed for review may include a max timing waveform, a min timing waveform, and a combined timing waveform that combines the x-y coordinates of the max and min timing waveforms, with the x-y coordinates of the min timing waveform shifted by an adjustment factor to be further described hereafter.

Each timing path in an ASIC or FPGA is described by max and min timing. For each type of timing (max or min), the typical STA tool 12 generates a timing report. The generated timing reports are pre-organized in directories and have specific naming conventions, indicated by: (a) project name, (b) functional mode, (c) PVT (Process, Voltage, Temperature) corner, (d) revision number, and (e) date of creation. The software program iterated by processor 120 runs over these directories and timing reports, selected by the user, opens the relevant timing reports and loads them into Excel. After a specific timing report is loaded into the memory 110, the software program under direction of processor 120 runs over the report, line by line, and the following data is extracted. These timing points will be used to calculate the x-y coordinates of the max timing waveform. Not all of the timing points will be directly reflected on the timing diagram, but the information therein is used to create the waveform. For convenience in reviewing follow-on truncated timing reports and timing waveforms, element numbers have been assigned to selected ones of the timing points where possible in the following Table 1, so as to show the mapping from timing report to waveform.

TABLE 1

Selected timing points extracted from ASCII Max/Min Timing Reports

| Timing Point | Element number |
|---|---|
| Start point | 202 |
| End point | 204 |
| Clock name(s) | 206; 207 |
| Clock launching edge(s) | 208 |
| Clock sampling edge(s) | 219 |
| Launching clock delay (LCD) | 212 |
| Capturing clock delay (CCD) | 214 |
| External delay | 216 |
| Clock uncertainty | 228 |
| Clock latency | 229 |
| CRPR (Clock Reconvergence Pessimism Removal) | Not shown in the max/min reports |
| DAT (Data Arrival Time) | 220 |
| DRT (Data Required Time) | 222 |
| Total timing slack | 224 |

Clock uncertainty, clock latency and CRPR are all part of the jitter and while accounted for as part of the timing points extracted from the original ASCII timing report, cannot be easily seen visually, although jitter will be shown in latter figures in a zoomed-in view on some of the timing waveforms. LCD and CCD are calculated by the design engineer from extracted data contained in the truncated or collapsed max/min ASCII timing reports, as described hereafter.

Accordingly, as will be seen in more detail below referring FIGS. 3-6, a method of converting a timing report to a timing waveform is described in which each of the above timing points in Table 1 forms part of a truncated or collapsed timing report of timing points extracted from the original ASCII timing report read into memory. These timing points are used to calculate x-y coordinates so as to create a timing waveform that reflects the behavior of an electrical signal in an electronic device such as an ASIC or FPGA, providing visual data for the designed to determine whether or not the device meets required timing specifications.

FIG. 3 is an example of a collapsed portion of a full max timing report generated by a STA tool for an output port of an ASIC and read into memory of the system, the collapsed portion extracted from memory and illustrating the timing points used for creating the x-y coordinates of a max timing waveform. FIG. 3 represents a screenshot of an excel spreadsheet of the filtered or collapsed max ASCII timing report for an output port, mfio[2] of an ASIC. The screenshot contains only the timing points extracted from the original max ASCII timing report that was generated from the STA tool 12 and read into memory 110.

Referring to FIG. 3, the start point 202 is described by a string in which a rising edge triggered FF is clocked by a clock having the name "aferxck". This is the clock name 206 for the start point 202. The endpoint 204 (output port mfio[2] is clocked by clock name "spick". This is the clock name 207 for the endpoint 204. Of note, the path type indicates "max", thus this is data from a max ASCII timing report.

The clock launching edge 208 is denoted by the first line, clock aferxck (rise edge). On the resultant waveform, the clock launching edge will occur at 37.5 ns from the beginning of the clock on the aferxck timing line diagram. The launch clock delay (LCD) calculation is determined as a difference between the value corresponding to string core/u_xbu/spi_cs_1_0_n_reg/CK (GFSDPRB_1), or 44.662 (representing the launch clock 203) and the clock launching edge 208 of 37.5 ns. Accordingly, LCD 212 is 7.182 ns; this will be reflected on the resultant max timing waveform. Similarly, the designer calculated CCD 214 from two values, the capture clock 211 (mfio[9] (inout)=89.19 ns) minus the capture clock edge 219 (see clock spick (fall edge)=75.00 ns). Accordingly, the CCD 214=14.19 ns; this will be reflected on the resultant max timing waveform.

The external delay 216 is −5.00 ns. The data arrival time 220 (DAT) is 53.472 ns, the data required time 222 (DRT) is 83.990, and the total timing slack 224 is 30.518. Each of these timing points is converted to x-y coordinates for display as part of the max timing waveform. Additionally, a "max capturing clock edge" value, also called data delay 226 (DD), is calculated. This is a measurement from the launch point 205 (string core/u_xbu/spi_cs_1_0_n_reg/Q (GFSDPRB_1) =45.127 f (f denotes fall edge) until the end point 210 (mfio[2] in out=53.472 f. The data delay 226 (DD=8.345 ns). This is referred to as "Max" on the displayed waveform.

Figure 4:
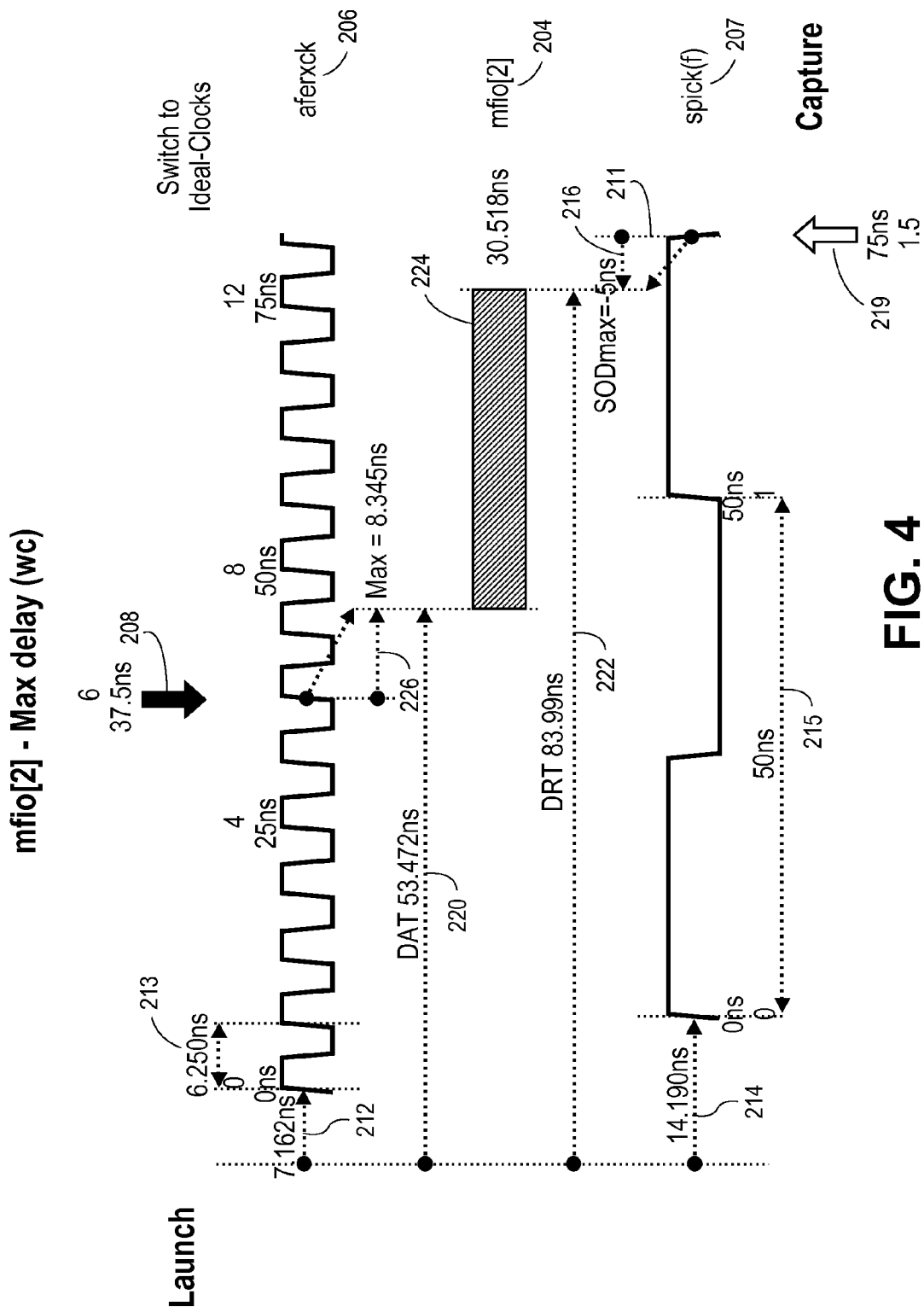
FIG. 4 is a timing diagram to illustrate an example of a max timing waveform created from the timing points in the collapsed report from FIG. 3.

FIG. 4 is a timing diagram to illustrate an example of a max timing waveform created from the timing points in the collapsed max timing report from FIG. 3. With the timing points and data extracted as indicated in FIG. 3, a max timing waveform can be created by generating a plurality of x-y coordinates so as to map the timing points into the x-y space. Referring to FIG. 4, there is shown a series of timing diagrams of a max timing waveform. As this waveform was created for an output port, the launch clock name 206 (aferxck), endpoint 204 (mfio[2]) and capture clock name (spick (f) are listed on the right hand side; if this was an input port these would have been on the left-hand side of the timing diagrams. In FIG. 4, "Switch to Ideal clocks" means drawing both waveforms, max on top of the min (as will be discussed in greater detail hereafter), without the effect of clock delays, thus the launch and capture clocks can be visualized as aligned and edge differences can be counted manually by sight. The waveform is titled by the name of the port being evaluated "mfio[2]", the type of report ("Max delay(wc)", which reflects a max timing waveform. The wc simply indicates a specific PVT corner (corner "wc"). As there are PVT variations between chips, this is just one example of a specific PVT corner of an ASIC.

From the max timing waveform diagram, the design engineer can visually see the clock launching edge at 37.5 ns (designated by arrow 208 and labeled at edge 6), LCD 212 (7.162 ns), as well as the capture clock delay (CCD) 214 of 14.190 ns. The external delay 216 is displayed as SODmax (−5 ns) from a line and direction indicating the capture clock 211 backward to DRT 222.

Additionally, there may be provided the clock period of the launch clock 213 and the clock period of the capture clock 215; this data is extracted from a different report. Additionally, the captured clock edge (designated by arrow 219 at 75 ns) on capture clock spick (f) is displayed. Each of the DAT 220 (53.472 ns), DRT 222 (83.99 ns), and total timing slack 224 (30.518 ns), which represents margin to max path, is also displayed.

Therefore, FIGS. 2-4 show and describe a method of converting an ASCII timing report (such as is generated and/or output from a STA tool) to a timing waveform to evaluate the behavior of an electrical signal in an ASIC or FPGA. In the method, an original, complete ASCII timing report is read into the memory 110 of system 100. Under control of the processor 120, a software program is iterated in order to extract selected timing points from the stored report. In an example, this may be displayed and manipulated in an Excel spreadsheet environment. The timing points that are extracted are then used to generate a timing waveform for display on the display 130, for review by a designer to evaluate whether a given external port or internal pin of the ASIC or FPGA meets required timing specifications.

Thus, the method and system heretofore described may provide the ability to generate a timing waveform illustrating both launching and capturing clocks. In one example, the timing waveform is generated by parsing a max ASCII timing report and drawing the max timing waveform, as shown best in FIG. 4. FIG. 4 illustrates to the designer at least that there is a margin time in the capturing window of 30.518 ns for max path which meets timing specifications. Further, the max capturing clock edge or data delay 226 value (Max=8.345 ns) is displayed. This value will be significant in determining an adjustment factor for creating a combined waveform, to be discussed in more detail below.

FIG. 5 is an example of a collapsed portion of a full min timing report, such as is generated by a STA tool, for example, for an output port of an ASIC and read into memory of the system, the collapsed portion extracted from memory and illustrating the timing points used for creating the x-y coordinates of a min timing waveform. As this collapsed min ASCII timing report is nearly identical to that shown and described in FIG. 3, only the differences are discussed in detail.

The same timing points are utilized for calculating the x-y coordinates for creating the min timing waveform. Of note, the path type indicates "min", thus this is data from a min ASCII timing report. The calculations for LCD 212, CCD 214 and data delay 226' are different for the min waveform. This is due in part to the different values of the launch clock 203, capture clock 211, capture clock edge 219, launch point 205 and end point 210. Further, the data arrival time 220, data required time 222 and total timing slack 224' values differ in the truncated min ASCII timing report as compared to the max timing report of FIG. 3. The external delay 216' has a positive value of +5.00 ns. Additionally, the calculated data delay 226 is also referred to as a "min capturing clock edge", and notated as "Min" on the min timing waveform. Like the "Max" value, this parameter will be used in determining an adjustment factor for creating a combined timing waveform.

Figure 6:
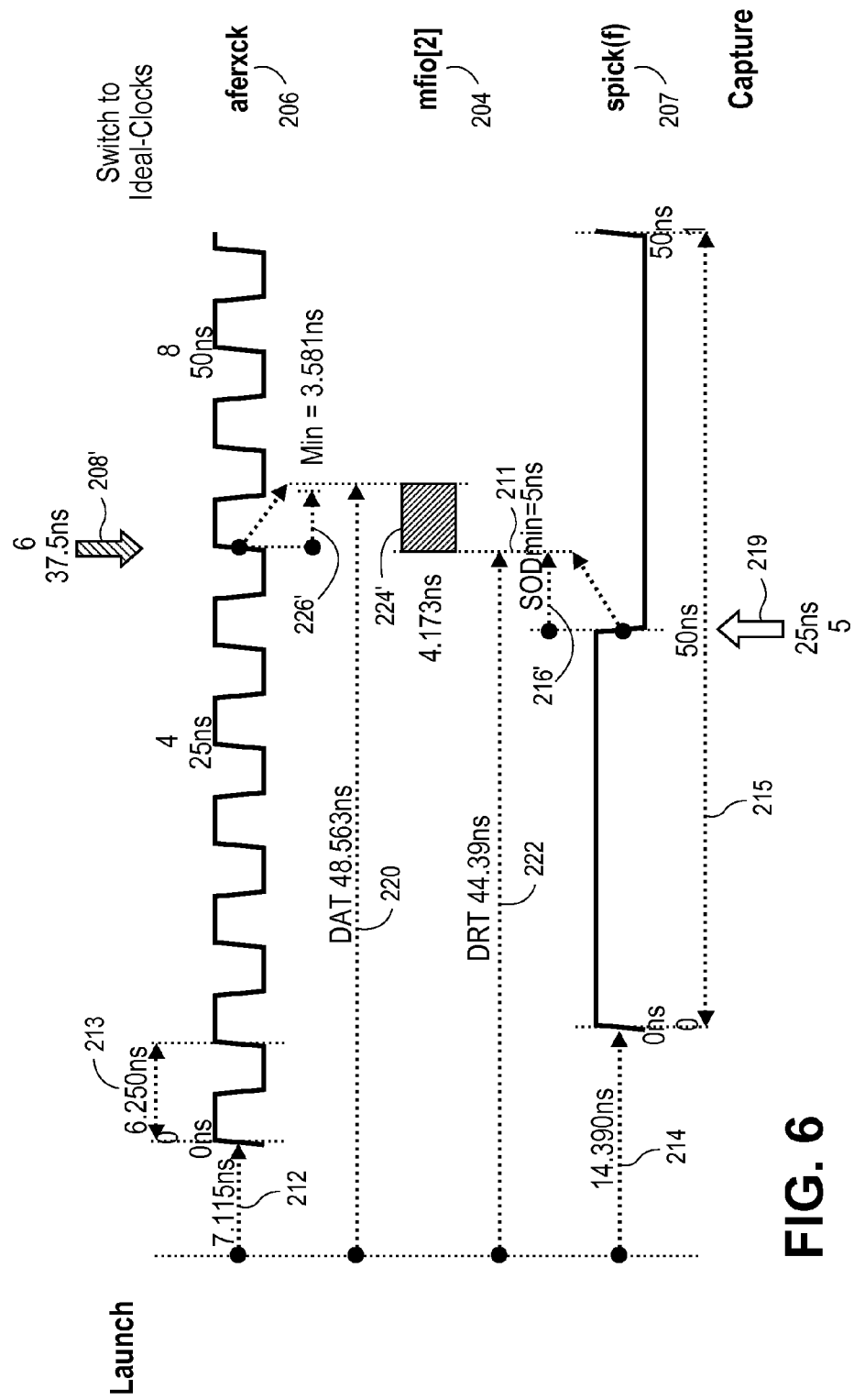
FIG. 6 is a timing diagram to illustrate an example of a min timing waveform created from the timing points in the collapsed report from FIG. 5.

FIG. 6 is a timing diagram to illustrate an example of a min timing waveform created from the timing points in the collapsed report from FIG. 5. FIG. 6 is similar to FIG. 4; thus a detailed explanation thereof is omitted for purposes of brevity.

Referring to FIG. 6, the min timing waveform like the max timing waveform shows timing diagram for both the launching and capturing clocks. Here, the SODmin (216') is shown as +5.00 ns, the data delay (Min=3.581 ns) and the total timing slack 224' is 4.173 ns. This slack is within the capture window, the capture clock having a period 215 of 50 ns, a capture clock edge 219 at 25 ns with CCD=14.390 ns. Accordingly, the designer understands from this display that there is a margin time in the capturing window of 4.173 ns for min path without violating timing requirements.

Timing waveform representations of the ASCII timing reports initially described in FIGS. 3 and 5 can therefore be intuitive to the design engineer. Accordingly, the timing waveform representations shown in FIGS. 4 and 6 can thus yield comprehensive and fast STA.

The stand alone max and min timing waveforms shown in FIGS. 4 and 6 give the ASIC/FPGA design engineer a relative view of different elements in the timing path that the ASCII timing reports just cannot provide. For example, and referring to FIGS. 4 and 6, the waveforms provide a visual reference to the designer of at least the following: (a) relative periods of launch/capture clocks (see faster launch clock/lower capture clock); (b) relative delays of launch/capture clocks (greater delay in the capture clock even without knowing the actual delay, can see this delay); (c) relative values (based on length of the arrows) of SODmax, SODmin, SIDmax, SIDmin (SID representing set input delay when evaluating an input pin/port instead of an output port); (d) relative directions of SODmax, SODmin, SIDmax, SIDmin (based on direction of arrows); and (e) relative size of DAT/DRT.

Figure 7:
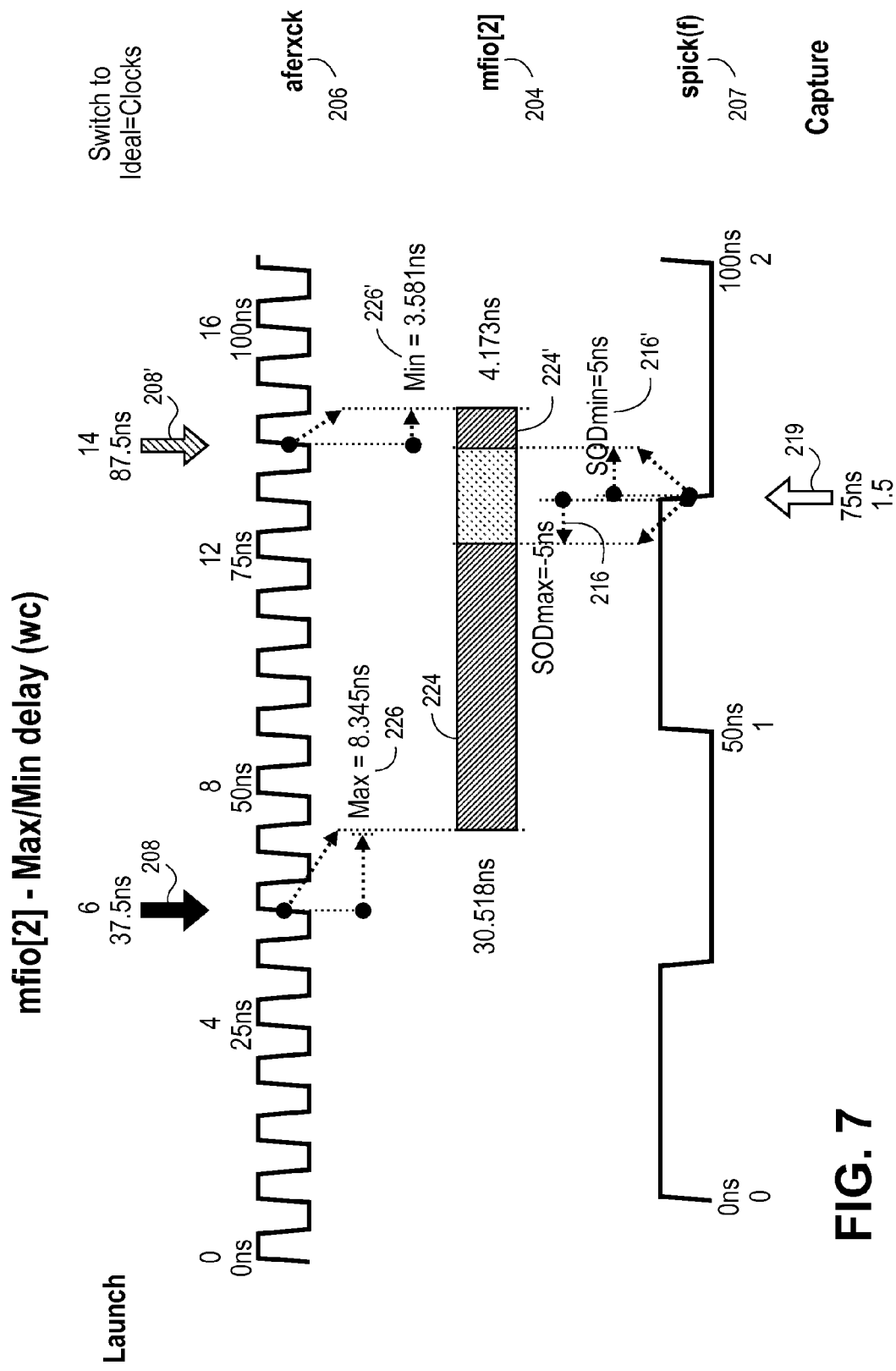
FIG. 7 is a timing diagram to illustrate an example of a combined timing waveform created from the max and min timing waveforms of FIGS. 4 and 6.

FIG. 7 is a timing diagram to illustrate an example of a combined timing waveform created from the max and min timing waveforms of FIGS. 4 and 6. So far, a system and method have been described for generating the max and min timing waveforms from respective max and min ASCII timing reports. FIG. 7 is provided to describe a method for creating a combined timing waveform from a max ASCII timing report and a min ASCII timing report, such as are generated by a static timing analysis (STA) tool for an electronic device such as an application specific integrated circuit (ASIC) or field programmable gate array (FPGA), each timing path in the electronic device being described by max and min timing.

In general, to create the combined timing waveform, x-y coordinates for a first waveform are to be calculated based on data contained in the max ASCII timing report, and x-y coordinates for a second waveform are to be calculated based on data contained in the min ASCII timing report. To generate the combined timing waveform, the coordinates for both waveforms will need to be aligned, thus the calculated x-y coordinates of the second waveform are to be shifted by an adjustment factor. The combined waveform is then generated with the calculated x-y coordinates of the first waveform and the shifted x-y coordinates of the second waveform. The combined waveform should reflect the behavior of an electrical signal in the electronic device, e.g. ASIC or FPGA.

FIGS. 3-6 have described the calculation of coordinates from timing points in order to generate a max timing waveform and a min timing waveform. Accordingly, the data from FIGS. 3-6 may be employed to generate the combined timing waveform illustrated in FIG. 7.

The combined timing waveform describes the exact behavior of an electrical signal in the electronic device such as an ASIC or FPGA. Accordingly, as STA tool post-processing data for both max and min paths is present, and can be filtered and converted into visual waveform data that can tell the designer if timing requirements are being satisfied so as to avoid critical design or manufacturing flaws, the combined timing waveform may be of superior value to chip designers. Accordingly, the display 130 under control of processor 120 displays the combined timing waveform of FIG. 7 thereon for review by a designer to evaluate whether a given external port or internal pin of an ASIC meets required timing specifications.

In order to create this combined waveform, both max and min information should be available. As previously noted in FIGS. 3 and 5, only selected timing points to evaluate max and min timing paths for both the launching and capturing clocks are extracted from the original max and min ASCII timing reports. Once the selected max and min information is available, the x-y coordinates for creating the timing diagrams are to be drawn on top of each other, with an adjustment factor calculated in advance and applied to the x-y coordinates of the min timing waveform so that it aligns with the coordinates of the max timing waveform.

This adjustment factor is a pre-calculated adjustment that is determined within the software program iterated by processor 120. In general, an algorithm in the program determines a clock edge difference between a max capturing clock edge and a min capturing clock edge, the timing difference representing the adjustment factor by which the x-y coordinates of the min timing waveform are shifted to align with the x-y coordinates of max timing waveform, so as to be able to create the combined waveform.

The adjustment factor is referred to as a Capture Clock Edge Difference (CCED) factor. CCED is defined as the timing difference between the max capturing clock edge (Max) and the min capturing clock edge (Min):

CCED=Max capturing clock edge (see 219, FIG. 4)−Min capturing clock edge (see 219, FIG. 6), or CCED=75 ns−25 ns=50 ns.

Specifically, the CCED value is added so that the x-y coordinates of the min timing waveform are shifted right by CCED. Thus, when the shifted x-y coordinates of the second (min) timing waveform are placed on top of the x-y coordinates of the first (max) timing waveform, the timing diagrams for the launching and capturing clocks are substantially in alignment.

Referring now to the combined timing waveform of FIG. 7 for the output port mfio[2], there is shown timing point data from both the max and min timing reports. Some of the data is omitted, such as certain calculated delay data and report-specific delays for max and min paths. The launch clock (aferxck) timing diagram is in alignment as is the capture clock timing diagram on clock edges (219). Both Max 226 and Min 226' values are displayed, as are the external delays SODmax (216) and SODmin (216'). Also displayed for the designer is the launch clock edge (arrow 208 at edge 6) and a "next" launch clock edge 208'. Shown by arrow 208' at edge 14, this represents the launch clock edge of the min timing waveform after being shifted by CCED, from where the Min delay is measured. The combined waveform further displays the capture clock edge at 219.

Both total timing slack for max path (224) and min path (224') are displayed on the combined timing waveform. These values represent margins to meet acceptable timing requirements for the ASIC/FPGA. Accordingly, this combined timing waveform is generated by parsing the separate max and min timing reports and drawing the max/min combined timing waveform, as shown best in FIG. 7.

In FIG. 7, the combined waveform shows that there is a margin time in the capturing window of 30.518 ns for max path and 4.173 ns for min path. A displayed waveform on display 130 such as FIG. 7 permits the design engineer to assess instantly if the timing path meets the functional requirements across all PVT corners and whether an electronic device such as an ASIC or FPGA will function correctly under such conditions. Redundant information is omitted from the max/min combined timing waveform as the intention is that the design engineer will review the relevant timing waveforms as a complementary set, e.g., each of the Max timing waveform, Min timing waveform, and Max/Min combined timing waveform.

Figure 8:
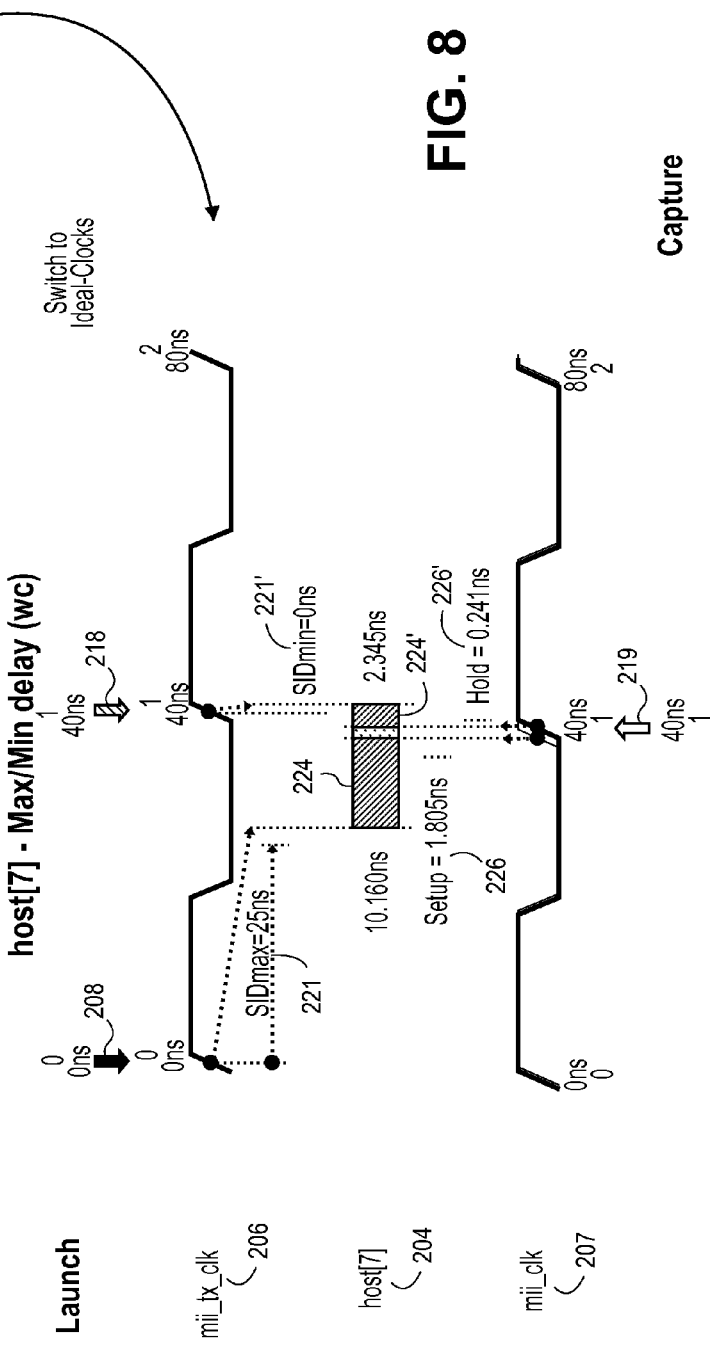
FIG. 8 is a screenshot of a portion of an excel summary sheet of input ports for a given ASIC, with the calculated displayed combined timing waveform for a selected input port host[7] of the ASIC.
Figure 9:
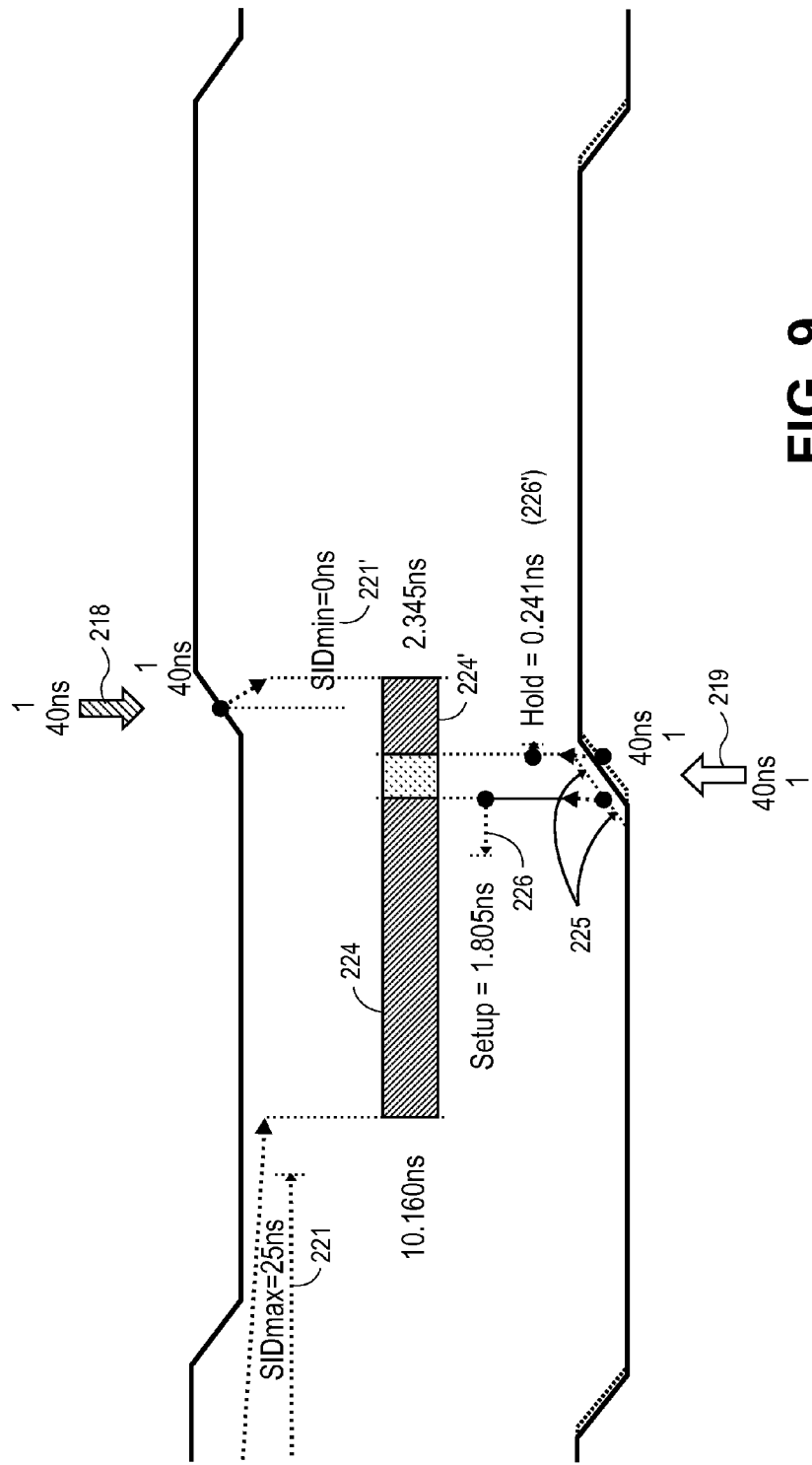
FIG. 9 is a zoom-in view of a portion of the combined waveform of FIG. 8 to illustrate the jitter in the combined waveform.

FIG. 8 is a screenshot of a portion of an excel summary sheet of input ports for a given ASIC, with the calculated displayed combined timing waveform for a selected input port "host[7]" of the ASIC; and FIG. 9 is a zoom-in view of a portion of the combined waveform of FIG. 8 to illustrate the jitter in the combined waveform.

FIG. 8 has been provided to illustrate how timing waveform reports can be categorized and stored for display within the system 100. The upper portion of FIG. 8 shows a screenshot of an Excel file of stored timing waveforms created for a plurality of input ports of a given ASIC. The summary report identifies the port by name and provides summary data including the max and min rise and fall for input delay, the related clock (launch clock), and provides the margin, min timing waveform (Wh), Min/max combined timing waveform (Whs) for a IO margin—Min path evaluation, and margin, max timing waveform (Ws), Max/min combined timing waveform (Wsh) for a IO margin—Max path evaluation. The values of the margins correspond to the total timing slack. If these values are positive, the timings are within an acceptable timing requirement.

A designer can select a desired timing waveform for display by clicking on a selected cell, which acts as a hypertext link to open a displayed waveform as shown below the partial screenshot in FIG. 8. In this example, the designer clicks on Wsh for input port "host[7]". The action of clicking on the Wsh cell automatically brings up the combined max/min timing waveform for this input port on the screen of display 130. As this is an input port, the launch clock name 206 "mii_tx_clk", start point 202 for the port "host[7] and capture clock name 207 "mii_clk" are displayed on the left hand side. Here, the data delay 226 or Max (max capturing clock edge) for the max timing waveform is synonymously referred to as "Setup". The Min 226' or min capturing clock edge is referred to as "Hold". As this is an input port, there is no set output delay (SOD) for the max and min timing reports, rather a set input delay (SID) for max and min paths; SIDmax=25 ns (221) and SIDmin=0 ns (221'). The total timing slack 224 or margin for the max path is 10.160 ns; the total timing slack 224' or margin for the min path is 2.345 ns. As both are positive, input port host[7] meets timing requirements.

FIG. 9 is a zoom-in view to show that jitter is also included in the combined waveform. At zoom magnification, jitter can be seen around the capture clock edge 1 transition, denoted by arrows 225.

Figure 10B:
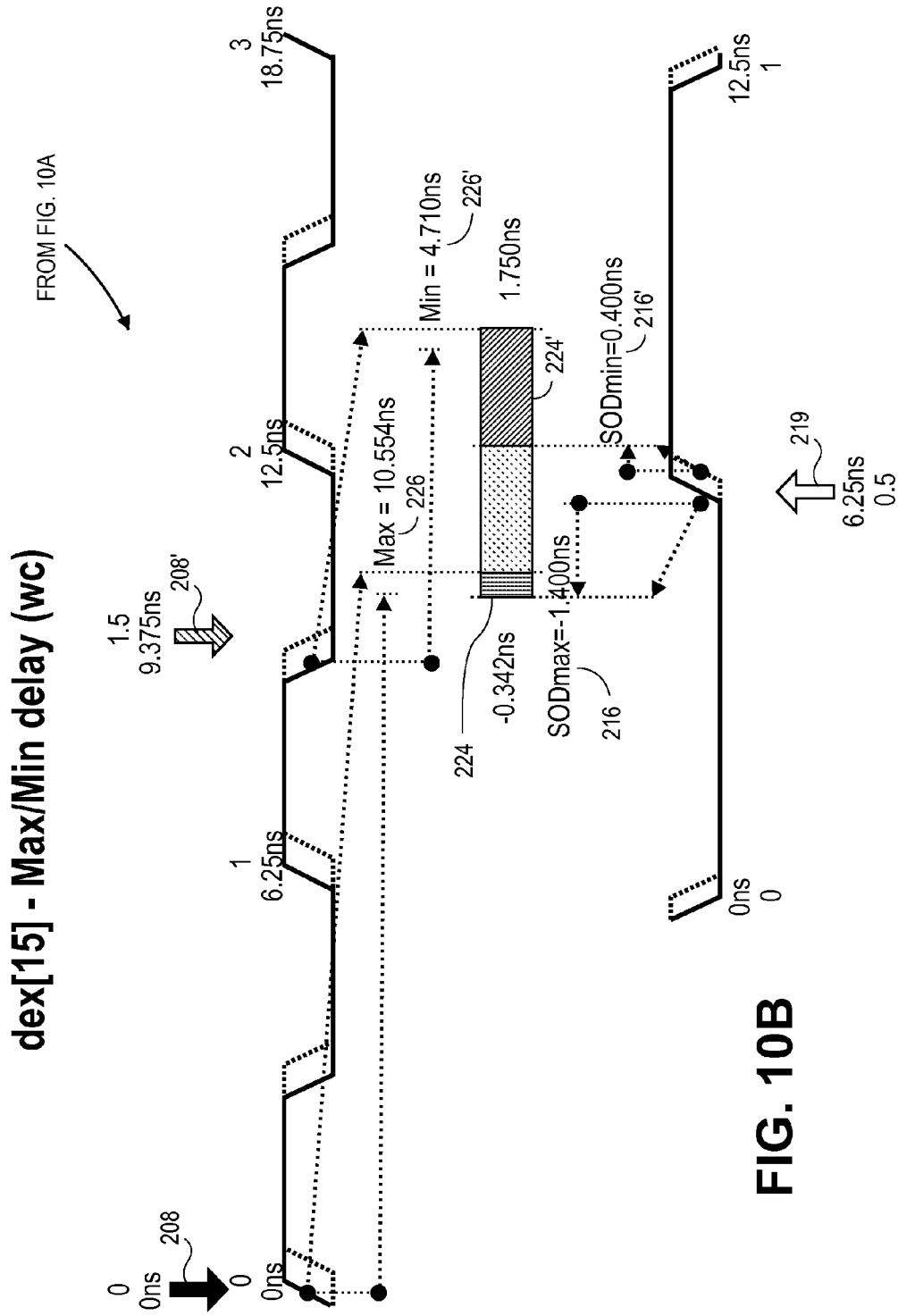
FIG. 10B is a zoomed-in portion of a calculated displayed combined timing waveform for a selected output port dex[15] of the ASIC of FIG. 10A to illustrate an out-of-timing condition for the port.

FIG. 10A is a screenshot of a portion of an excel summary sheet of output ports for a given ASIC; and FIG. 10B is a zoomed-in portion of a calculated displayed combined timing waveform for a selected output port dex[15] of the ASIC of FIG. 10A to illustrate an out-of-timing condition for the port. Here, for a series of "dex" output ports, the combined max/min timing waveforms for the max path have violations in the capturing window for the max path; in fact each is out of range. For example, output port dex[15] has been selected for review and the combined timing waveform displayed below the excel summary screenshot for a given ASIC. While the total timing slack 224' (margin) for the min waveform is in range (1.750 ns), the total timing slack 224 for the max path is in violation of timing requirements (−0.342 ns).

Figure 1:
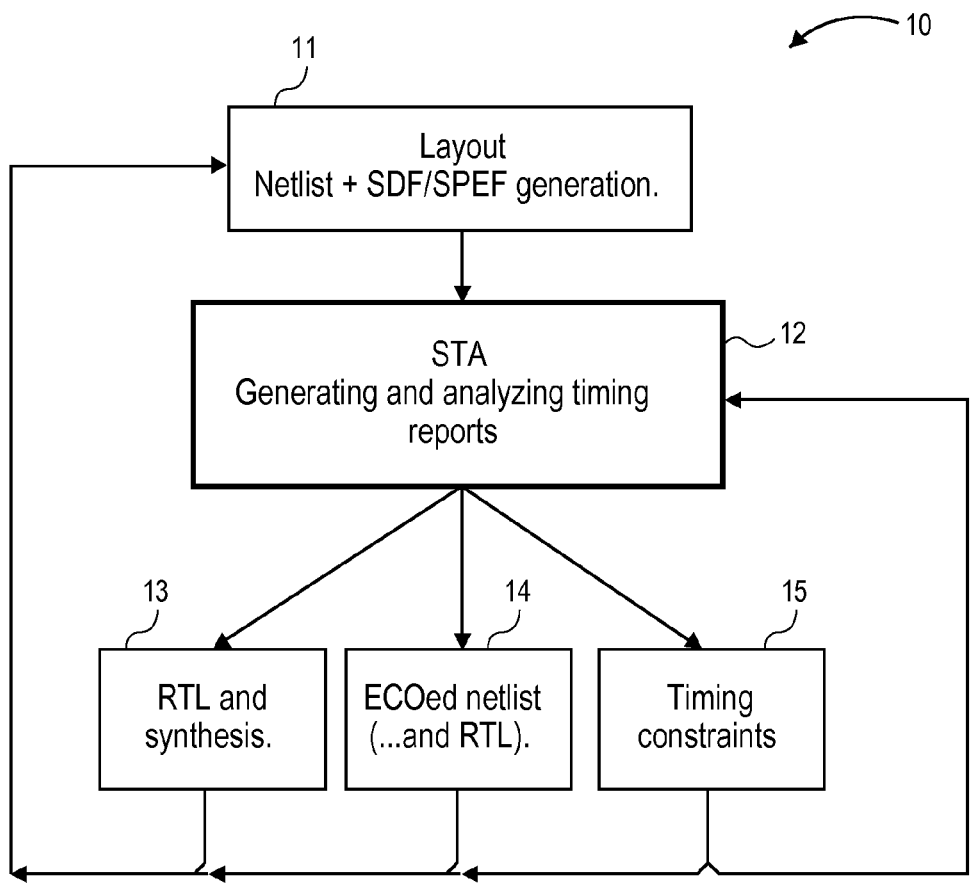
FIG. 1 is a block diagram of a conventional art ASIC timing closure loop.

The timing violation means that the specific timing path exceeds the allowed timing budget. The corrective actions available to the designer can be of various kinds; the designer looks to those which do not require a design change first. One option might be to change a definition to the STA tool, an example being to change SODmax from −1.400 ns to −1.000 ns (delaying the capture clock by 0.400 ns.). The additional 0.400 ns delay will bring the total timing slack for the max path just into margin (+0.058 ns). This change will only require running the timing constraints module 15 in FIG. 1 and then the STA tool 12 to generate another max and min ASCII timing report. This would be a relatively "least painful" change which does not require a design change. Another possible change to bring the timing path within the allowed timing budget might be inserting stronger cells in the violating timing path or make the launch clock earlier by inserting stronger cells in the launch clock path. This will require running ECO tool 14 in FIG. 1 followed by the Layout tool 11 and then regenerating timing reports in STA tool 12. If any of these solutions won't do, it might lead to a design change, which is the "most painful" option to the designer and the longest one as far as schedule hit, requiring the RTL change and synthesis tool 13 in FIG. 1.

Figure 11:
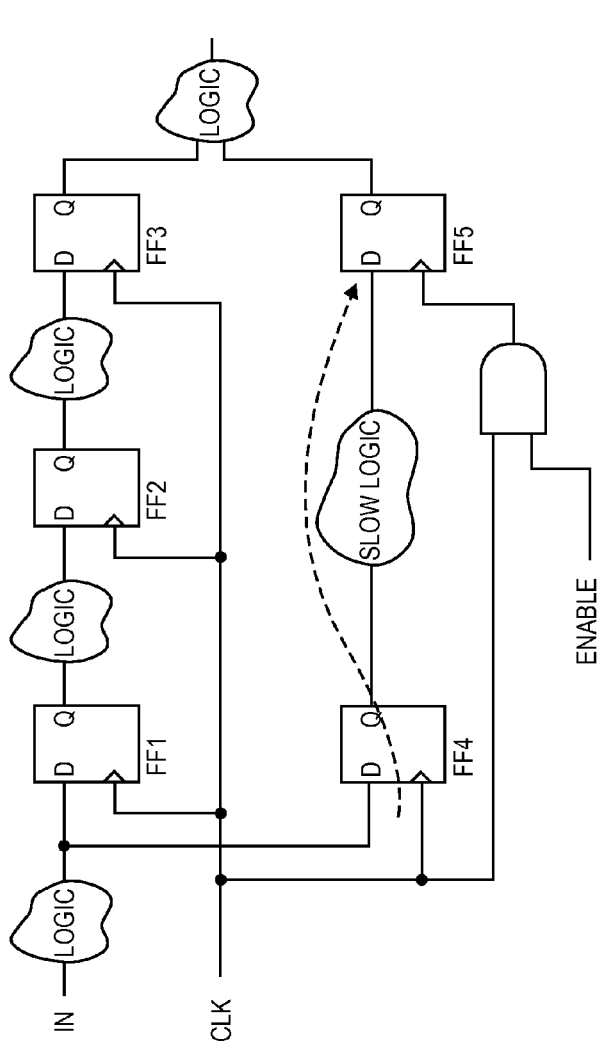
FIG. 11 is a block diagram to illustrate an example of single cycle versus multicycle logic clouds.
Figure 12:
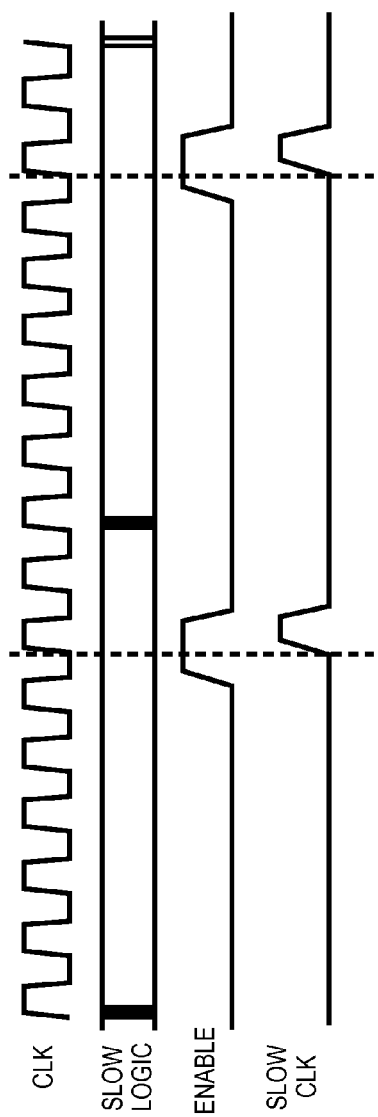
FIG. 12 is a timing diagram to show the difference between the CLK versus the Slow CLK that triggers FF5 in FIG. 11.

FIG. 11 is a block diagram to illustrate an example of single cycle versus multicycle logic clouds; and FIG. 12 is a timing diagram to show the difference between the CLK versus the Slow CLK that triggers FF5 in FIG. 11.

By default, the STA tool 12 performs timing calculations based on single clock cycle behavior. There are cases, due to the existence of slow logic inside an ASIC or FPGA, where a multi clock cycle behavior is required. One way to explain multicycle behavior is by comparing it against single cycle behavior. Referring to FIG. 11 there are depicted several logic clouds, marked "Logic", between flip flops driven by a similar clock, marked "CLK". Logic clouds should meet timing in a single clock cycle; however, the logic cloud in FIG. 11 notated as "Slow logic" is given a relaxed timing (i.e., allowed to meet timing in more than one cycle) it should meet, defined by a gating signal, marked by "ENABLE" in the figure.

Referring now to FIG. 12, the "ENABLE" signal "opens" the gate every predefined number of "CLK" cycles and triggers flop FF5 to sample only on the predefined cycle, i.e. skips the other "CLK" cycles. Accordingly, the above description of FIGS. 11 and 12 provides an introduction to multicycle path (MCP) issues in electronic devices such as ASICs and FPGAs.

In the case of MCP analysis, specific timing definitions, referred to as timing exceptions, are needed to "teach" the STA tool about the actual behavior of the logic inside the ASIC/FPGA. Based on the MCP definitions, the STA tool generates MCP timing reports which are more complex to analyze and comprehend by the designer than single clock cycle reports, especially min MCP. The min MCP analysis, since it is measured relative to max MCP, requires checking both max MCP and min MCP, so the latter cannot simply be deduced.

Figure 13:
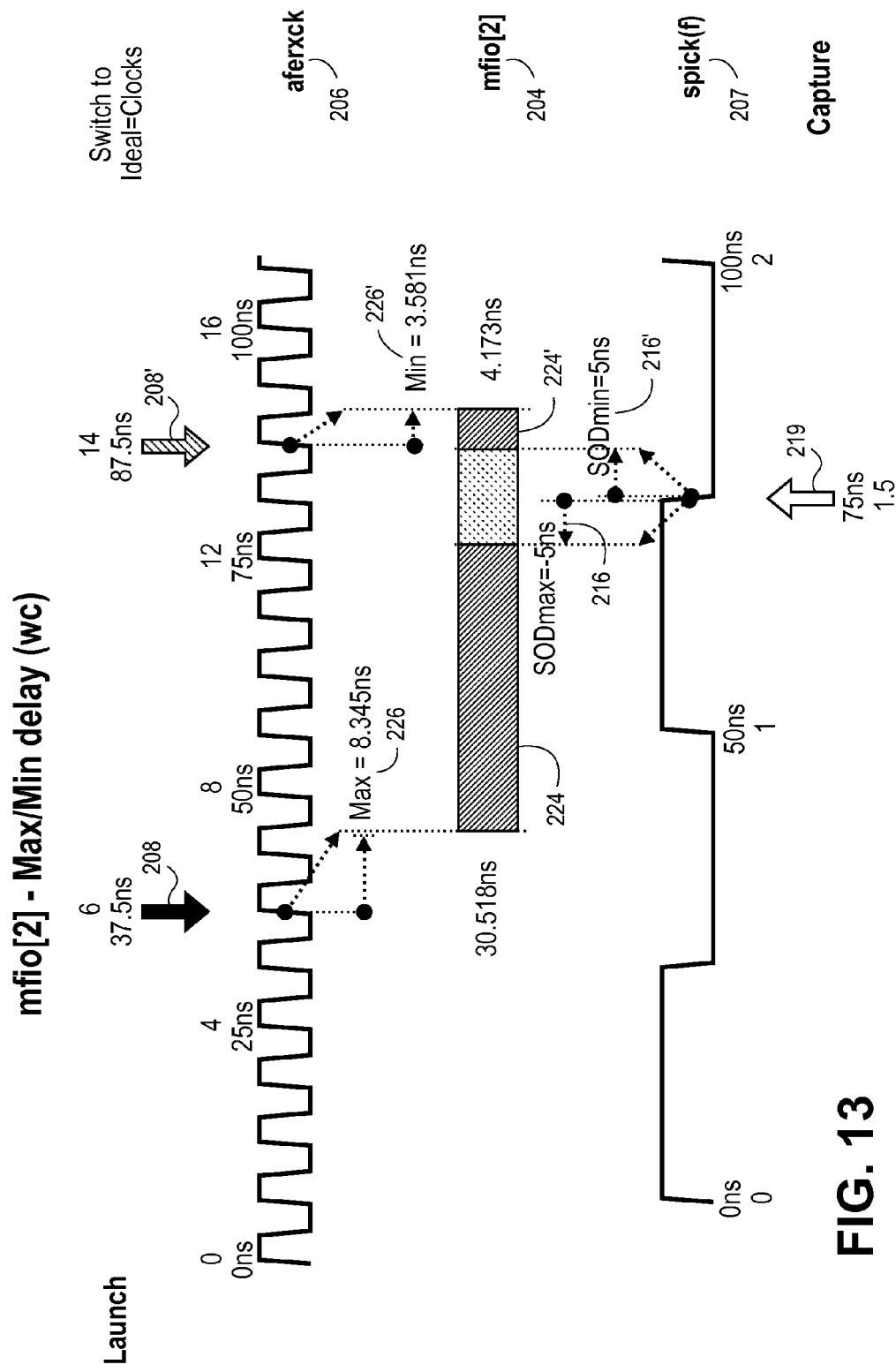
FIG. 13 is the combined timing waveform of FIG. 7 annotated with data reflecting min MCP and max MCP determinates for the output port mfio(2) of an ASIC.

FIG. 13 is the combined timing waveform of FIG. 7 annotated with data reflecting min MCP and max MCP determined for the output port mfio(2) of an ASIC. The combined timing waveform for a given port or pin of an ASIC/FPGA can be used to determine max MCP and min MCP values, also occasionally referred to as herein as "min MCP and max MCP definitions". The software program iterated by processor 120 is further configured to calculate the min MCP value, based on CCED, and present a clear visualization to the ASIC or FPGA designer, via the combined waveform on the display 130.

Referring to FIG. 13, the fast clock (aferxck) period is 6.25 ns; the slow clock (spick (f) period is 50 ns. Given this, the max MCP value is calculated as 12−6=6, which means that the logic cloud between the flop that is driven by fast clock (launch clock aferxck) at time 37.5 ns (clock launch edge 6), is allowed to complete its tasks within 6 full cycles (rising edge to rising edge) of the fast clock, before being sampled by the flop driven by the slow clock (spick(f)) at time 75 ns. This leads to max margin of 30.518 ns. Visually then, the max MCP value may be defined as clock edge distance (in cycles) in the fast clock between launch clock edge 208 (edge 6) and where the capture clock edge 219 would intercept—timing wise (at 75 ns on aferxck), or edge 12), meaning when the flop driven by slow clock (here spick (f)), as shown in FIG. 12 for example, samples the flop driven by the fast clock.

The min MCP value is calculated as the difference in the fast clock edges of aferxck (launch clock edges 208 (launch clock edge of max timing waveform), and 208' (launch clock edge of min waveform shifted by CCED, or next launch clock edge)), which is 14−6=8. In other words, this means that the fast clock triggered flop in FIG. 7 will launch next data only 8 fast clock cycles after the previous data was launched. This leads to min margin of 4.173 ns. Thus, the min MCP definition can be defined as clock edge distance between launch clock edge 208 and next launch clock edge 208' (and subsequent), thus if the designer defines min MCP=8, launch clock edges for next/new data occur at edge 6/37.5 ns, edge 14, 87.5 ns, edge 22, 122.5 ns, etc.

Figure 14:
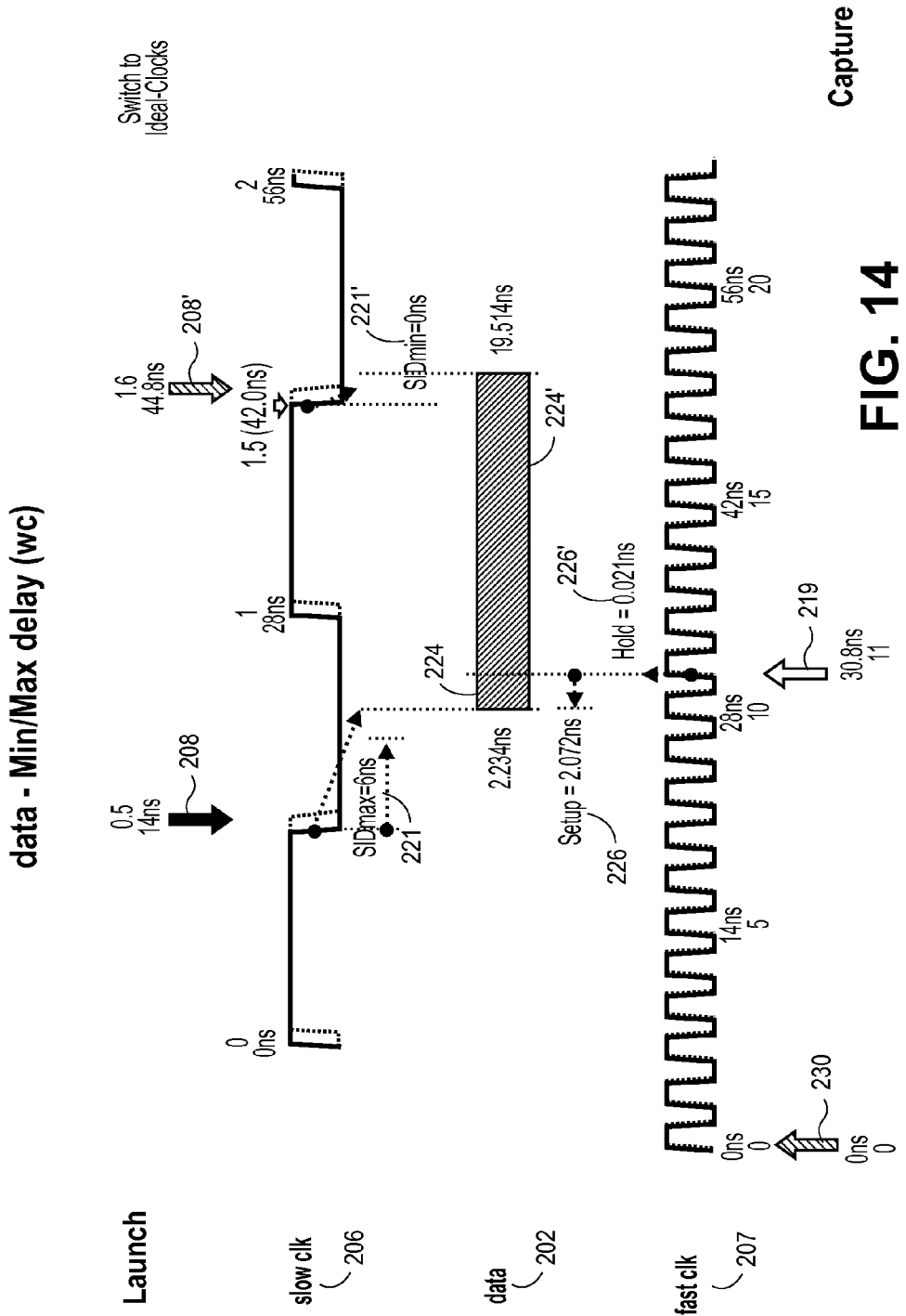
FIG. 14 is a combined timing waveform for an input port SFLASH_MISO of an ASIC in which verification of the min MCP indicates an incorrect min MCP definition.

FIG. 14 is a combined timing waveform for an input port data of an ASIC in which verification of the min MCP indicates an incorrect min MCP definition. Calculating the MCP definition, in general, is complex and most likely results in definition errors which are resolved only by several iterations or in worst cases, remains undetected, which might lead to a very expensive production flaw. Specifically, calculating the min MCP definition is the complex part as its definition is relative to the max MCP value. Thus, a combined timing waveform of max and min is required to calculate the min MCP definition and verify its accuracy.

FIG. 14 depicts an incorrect MCP definition, captured visually by the combined waveform, which creates a false picture of optimistic timing margin. As shown in FIG. 14, for the input port "data", the min MCP definition is calculated from the fast clock, here the capture clock 207. Referring to the capture clock 207 (fast clock), the min MCP is 11−0=11 and the min margin (total timing slack 224' of the min timing report) of 19.514 ns is hence too optimistic. The software program iterated by processor 120 is able to calculate min MCP misplace and warn the ASIC or FPGA designer that the min MCP definition was incorrectly defined.

The CCED in this case is: 30.8 ns (219)−0 ns(230)=30.8. Thus, the next launch edge (208') is shifted from launch edge (208) by 30.8 ns, landing at 44.8 ns. Such a shift creates a non-periodic distance of 11 fast clock edges, This non-periodic distance is realized by calculation of the ratio between the slow clock and fast clock which is 28/2.8=10. This leads to detection of the min MCP error which is 11−10=1. Such a difference means that the ASIC designer defined an incorrect min MCP definition, larger by 1.

Accordingly, the CCED calculation allows detecting visually that max and min launch clocks don't overlap precisely on the same edges, as is evident by the staggered or overlapping launch clocks in FIG. 14. Thus, the visually checking of the correct overlapping of max and min ideal (e.g., without real delays) launch clock edges in the combined waveform once CCED is calculated forms part of this min MCP value verification by the designer. The mistake in the definition for min MCP is that capture edge 11 (at 219) is analogous to edge 1 and not edge 0 (shown by arrow 230), as erroneously shown in FIG. 14. This is because definitions for ASIC/FPGA are designed periodically and STA measurements are done between synchronous clocks that are periodic. Thus, if the relative point is the capture edge 11 at 30.8 ns, then based on the periodic ratio or relationship between the clock periods (period=28 ns for slow clock, 2.8 ns for fast clock), the designer can tell from the combined waveform that the previous capture edge in the fast clock should be at edge 1 at 2.8 ns and the next capture edge should be at edge 21 at 58.8 ns, i.e. the distance must be the clock ratio between the clocks 50/2.8=10 clock periods or 10*2.8=28 ns as otherwise the relative behavior will not be periodic.

Therefore, a calculated min MCP value can be verified correct based on (a) calculation of x-y coordinates of launch max and min clocks, (b) calculating ratio of the launch and capture clock periods, and (b) checking correct overlapping of launch max and min ideal (without real delays) clock edges of the combined waveform by the designer's visual review of the combined waveform. If found in violation, the min MCP value (e.g., min MCP definition to the STA tool) can be corrected by the designer. As such, in the event of a multicycle timing path in the ASIC (in a given port or pin of an ASIC), the combined timing waveform provides the designer information about the accuracy or correctness of the min MCP value (e.g., min MCP definition to the STA tool).

Figure 15:
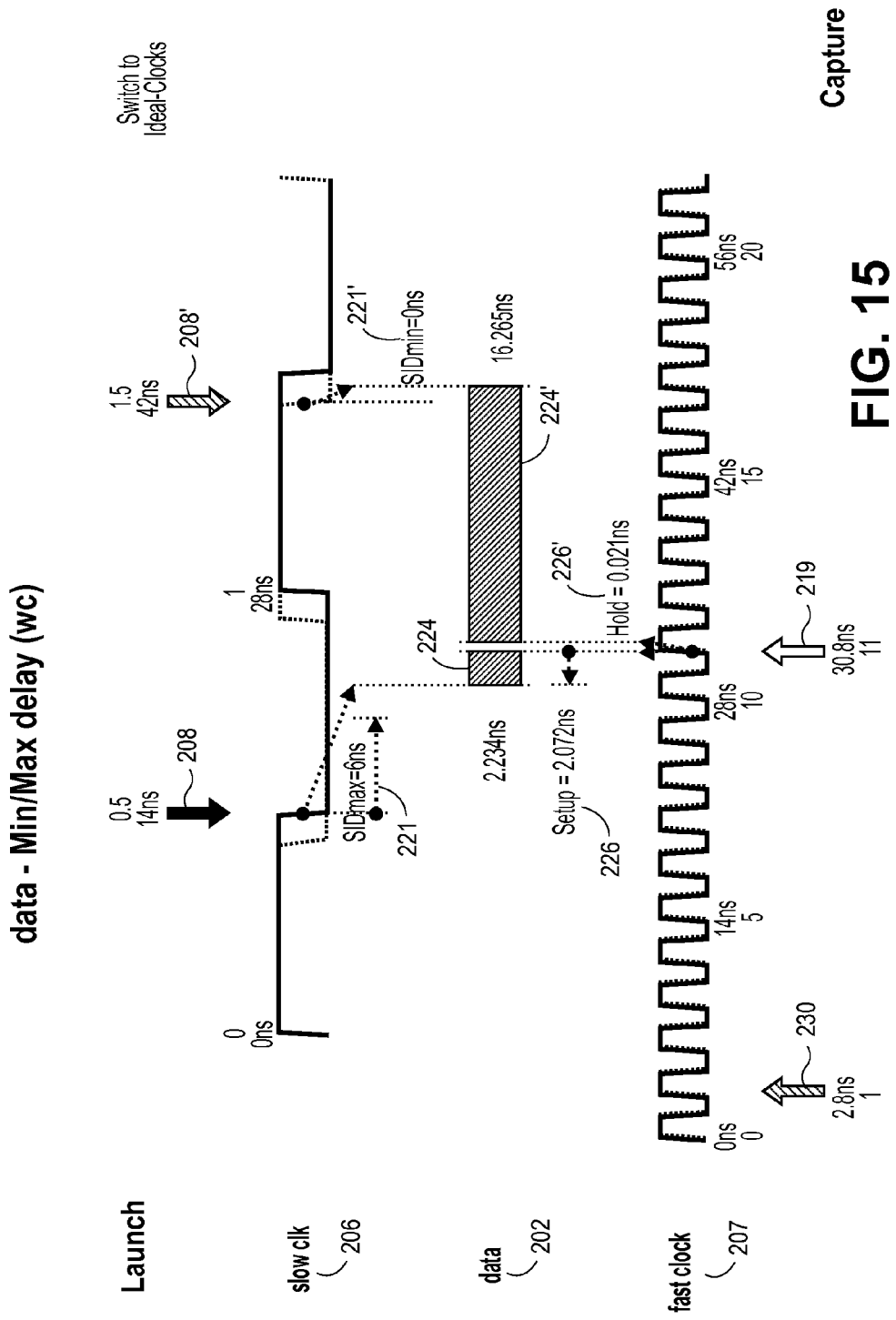
FIG. 15 is a combined timing waveform for the same input port in FIG. 14 after engineer correction based on a corrected min MCP definition.

FIG. 15 is a combined timing waveform for the same input port in FIG. 14 after engineer correction based on a corrected min MCP definition. Once the ASIC/FPGA designer is aware of the flaw, the min MCP definition is applied. For example, the ASIC/FPGA designer changes the definition of min MCP to the STA tool and then reruns the STA tool to generate correct max and min timing reports, so as to regenerate the combined timing waveform for the input port. FIG. 15 shows the same waveform with the corrected min MCP. The correct min MCP is now 11−1=10 and the min margin (corrected by adjustments made to the min MCP definition before rerunning STA tool 12 is only 16.265 ns as oppose to 19.514 ns.

Therefore, the example embodiments describe methods and a system of converting timing reports into timing waveforms that provide the ASIC/FPGA engineer the desired data to analyze any timing path in an easy but elaborate way. The display of max, min and combined timing waveforms provide a multitude or relative timing data to determine quickly, visually, whether a given timing path satisfies a timing requirement. Additionally, the methodology may automatically calculate the min MCP value and max MCP value, and the waveform data may offer/suggest corrections to the min MCP definition if mistakes are found.

Although the methods and system have been described relative to receiving timing report data generated by a STA tool, the example embodiments are not so limited. As STA tool developers have an ability to internally generate max and min ASCII timing reports, the methodology described herein could be incorporated into the STA tool such that STA tool manufactures may create the timing waveforms from ASCII timing report data generated internally therein. Moreover, rather than generating the timing waveforms from ASCII timing reports, the example methodology can be applied to scripts or subroutines/algorithms written into the STA tool software which access specific STA tool definitions (such as selected data for max and min timing paths of an external port or internal pin of an ASIC) from the internal database or memory of the STA tool, and generate the desired x-y coordinates of the max, min and combined waveforms, without the intermediate step of generating ASCII timing reports that are read into an internal or external memory and then parsed for specific timing points to build the waveforms.

Therefore, in an alternative embodiment, the example embodiments further encompass a method of creating a combined timing waveform from max and min timing data for a given external port or internal pin of an ASIC that is stored in a STA tool database. In this method, and under control of a software program iterated by the STA tool processor or processing medium, selected timing data related to a min path of the port or pin is extracted directly from the STA tool's internal database and converted into x-y coordinates for a min timing waveform. Selected timing data related to a max path of the port or pin is also extracted directly from the internal database and converted into x-y coordinates for a max timing waveform. The x-y coordinates of the min timing waveform are shifted by the adjustment factor, CCED, as described above and calculated by an algorithm of the software program invoked by the STA tool processor for example, so as to align with the x-y coordinates of max timing waveform and generate the combined timing waveform.

This methodology may be implemented by an algorithm or software program that is coded into the STA tool processing (such as STA tool 12) itself. For example, the STA tool manufacturer, having the knowledge of the contents and location of timing point data within the internal database of the STA tool, can program the extraction of desired data points related to the clocks, delays and other timing parameters or STA tool definitions required to calculate the x-y coordinates for the launch and capture clocks, e.g., the Max, Min, SODmax, SODmin, (or SIDmax, SIDmin), total timing slacks, (margins), CCED, clock launching and sampling edges, etc. for the max, min and combined timing waveforms shown in FIGS. 4, 6 and/or 7. These definitions could be accessed directly from the STA tool internal database, rather than first generating max and min ASCII timing reports and thereafter extracting these selecting timing points from the full reports to calculate the x-y coordinates, as described in previous embodiments.

The STA tool may be configured to have a display interface. The combined timing waveform is thus generated with the x-y coordinates of the max timing waveform and the shifted x-y coordinates of the min timing waveform, and may be displayed on the display interface of the STA tool. Thus, the displayed combined timing waveform may be subject to visual review by a designer and/or STA tool engineer to evaluate whether the given external port or internal pin of the ASIC meets required timing specifications, as previously described.

As described above regarding FIGS. 13-15, and in the event of a multicycle timing path in an ASIC or given port or pin of the ASIC, the same computer program or software in the STA tool itself for generating the combined timing waveform can include a further algorithm or sub-program to automatically calculate the min and max MCP definitions from the combined waveform as previously described. These calculations can be done automatically (based on CCED, calculation of x-y coordinates of launch max and min clocks, calculation of clock period ratio between launch and capture clock periods) and then verified visually by a designer's review of the generated combined timing waveform data (e.g., visually checking correct overlapping of max and min ideal launch clock edges in the combined waveform) to verify the accuracy of the min MCP value, and/or to correct/suggest changes should the definition be determined in error.

The example embodiments being thus described, it will be obvious that the same may be varied in many ways. Such variations are not to be regarded as departure from the example embodiments, and all such modifications as would be obvious to one skilled in the art are intended to be included herein.

I claim:

1. A method for creating a combined timing waveform from a max ASCII timing report and a min ASCII timing report for an application specific integrated circuit (ASIC), each timing path in an ASIC being described by max and min timing, the method being performed in a computer, the method comprising:
calculating x-y coordinates for a first timing waveform based on data contained in the max ASCII timing report,
calculating x-y coordinates for a second timing waveform based on data contained in the min ASCII timing report,
shifting the calculated x-y coordinates of the second timing waveform by an adjustment factor, which further comprises iterating an algorithm that determines a clock edge difference between a max capturing clock edge and a min capturing clock edge, the clock edge difference representing the adjustment factor by which the x-y coordinates of the second timing waveform are shifted to align with the x-y coordinates of the first timing waveform, and
generating a combined timing waveform with the calculated x-y coordinates of the first timing waveform and the shifted x-y coordinates of the second timing waveform, the combined timing waveform reflecting the behavior of an electrical signal in the ASIC.

2. The method of claim 1, wherein calculating x-y coordinates for the first timing waveform further includes:
storing the entire max ASCII timing report, and
extracting specific timing points from the stored report to calculate the x-y coordinates for the first timing waveform.

3. The method of claim 1, wherein calculating x-y coordinates for the second timing waveform further includes:
storing the entire min ASCII timing report, and
extracting specific timing points from the stored report to calculate the x-y coordinates for the second timing waveform.

4. The method of claim 1, wherein calculating x-y coordinates for either the first or second timing waveform includes:
loading a given one of the max and min ASCII timing reports into memory,
running through a given report line by line, and
extracting specific timing points from the reports for use in calculating the x-y coordinates.

5. The method of claim 4, wherein extracting includes extracting start point, end point and clock name.

6. The method of claim 4, wherein extracting includes extracting clock launching edges and clock sampling edges.

7. The method of claim 4, wherein extracting includes extracting delay parameters including launching clock delay, capturing clock delay and external delay.

8. The method of claim 4, wherein extracting includes extracting jitter-related data including clock uncertainty, clock latency and clock reconvergence pessimism removal.

9. The method of claim 4, wherein extracting includes extracting data arrival time, data required time and total timing slack.

10. The method of claim 1, further comprising:
determining a min multicycle path (MCP) value from the combined timing waveform indicative of multiple clock cycle behavior in the ASIC.

11. The method of claim 10, wherein the determined min MCP value is verified correct based on calculation of the adjustment factor, calculation of correct overlapping of max and min ideal launch clock edges, calculation of clock periods ratio between launch clock period and capture clock period, and visually checking correct overlapping of max and min ideal launch clock edges in the combined timing waveform, the min MCP corrected if in violation.

12. The method of claim 1, further comprising:
determining a max multicycle path (MCP) value from the combined timing waveform indicative of multiple clock cycle behavior in the ASIC.

13. A system for creating a combined timing waveform from a max ASCII timing report and a min ASCII timing report for an application specific integrated circuit (ASIC), each timing path in an ASIC being described by max and min timing, the system comprising:
a memory for storing the max and min ASCII timing reports,
a processor for calculating x-y coordinates for a first timing waveform based on data contained in the max ASCII timing report that the processor extracts from the memory, the processor calculating x-y coordinates for a second timing waveform based on data contained in the min ASCII timing report that the processor extracts from the memory, the processor shifting the calculated x-y coordinates of the second timing waveform by an adjustment factor, which further comprises the processor iterating an algorithm to determine a clock edge difference between a max capturing clock edge and a min capturing clock edge, the clock edge difference representing the adjustment factor by which the x-y coordinates of the second timing waveform are shifted to align with the x-y coordinates of the first timing waveform, and a display generating a combined timing waveform under direction of the processor with the calculated x-y coordinates of the first timing waveform and the shifted x-y coordinates of the second timing waveform, the combined timing waveform reflecting the behavior of an electrical signal in the ASIC.

14. A method of calculating multicycle path (MCP) values for a given timing path in an application specific integrated circuit (ASIC) or field programmable gate array (FPGA), each timing path in the ASIC/FPGA being described by max and min timing, the MCP values indicative of multi clock cycle behavior in the ASIC/FPGA, the method being performed in a computer, the method comprising:

calculating x-y coordinates for a first timing waveform based on selected data points extracted from a max ASCII timing report, calculating x-y coordinates for a second timing waveform based on selected data points extracted from a min ASCII timing report, shifting the calculated x-y coordinates of the second timing waveform by an adjustment factor, which further comprises iterating an algorithm that determines a clock edge difference between a max capturing clock edge and a min capturing clock edge, the clock edge difference representing the adjustment factor by which the x-y coordinates of the second timing waveform are shifted to align with the x-y coordinates of the first timing waveform, generating a combined timing waveform with the calculated x-y coordinates of the first timing waveform and the shifted x-y coordinates of the second timing waveform, determining a min multicycle path (MCP) value from the combined timing waveform, and determining a max multicycle path (MCP) value from the combined timing waveform.

15. The method of claim 14, wherein the determined min MCP value is verified correct based on calculation of x-y coordinates of launch max and min clocks, checking correct overlapping of launch max and min ideal (without real delays) clock edges of the combined timing waveform, calculating clock periods ratio between launch clock period and capture clock period, and a visual review of the combined timing waveform, the min MCP value corrected if in violation.

16. A method of creating a combined timing waveform from max and min timing data for a given external port or internal pin of an ASIC, the max and min timing data stored in a database of a STA tool, the method being performed in a computer, the method comprising:

extracting selected timing data related to a min path of the port or pin from the STA tool's database, converting the extracted data into x-y coordinates for a min timing waveform, extracting selected timing data related to a max path of the port or pin from the STA tool's database, converting the extracted data into x-y coordinates for a max timing waveform, shifting the x-y coordinates of the min timing waveform by an adjustment factor, which further comprises iterating an algorithm that determines a clock edge difference between a max capturing clock edge and a min capturing clock edge, the clock edge difference representing the adjustment factor by which the x-y coordinates of the second timing waveform are shifted to align with the x-y coordinates of the first timing waveform, generating a combined timing waveform with the x-y coordinates of the max timing waveform and the shifted x-y coordinates of the min timing waveform, and displaying the combined timing waveform for review by a designer to evaluate whether the given external port or internal pin of the ASIC meets required timing specifications.

17. The method of claim 16, further comprising:

determining a min multicycle path (MCP) definition and a max MCP definition from the combined timing waveform, should a multicycle timing path exist in the given external port or internal pin of the ASIC.

18. The method of claim 17, wherein the displayed combined timing waveform provides the designer information about correctness of the min MCP definition.

\* \* \* \* \*